(12) United States Patent
Watanabe

(10) Patent No.: US 8,773,173 B2
(45) Date of Patent: Jul. 8, 2014

(54) SEMICONDUCTOR DEVICE, IMAGE DISPLAY DEVICE, STORAGE DEVICE, AND ELECTRONIC DEVICE

(71) Applicant: Semiconductor Energy Laboratory Co., Ltd., Atsugi (JP)

(72) Inventor: Kazunori Watanabe, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/713,323

(22) Filed: Dec. 13, 2012

(65) Prior Publication Data

US 2013/0162305 A1 Jun. 27, 2013

(30) Foreign Application Priority Data

Dec. 22, 2011 (JP) ................. 2011-281648

(51) Int. Cl.
*H03B 1/00* (2006.01)
*H03K 3/00* (2006.01)

(52) U.S. Cl.
USPC .......................... 327/108; 327/112

(58) Field of Classification Search
USPC ................................ 327/108, 112
See application file for complete search history.

(56) References Cited

U.S. PATENT DOCUMENTS

| | | |
|---|---|---|
| 4,644,190 A | 2/1987 | Eberhard et al. |
| 5,731,856 A | 3/1998 | Kim et al. |
| 5,744,823 A | 4/1998 | Harkin et al. |
| 5,744,864 A | 4/1998 | Cillessen et al. |
| 6,121,660 A | 9/2000 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Hai L Nguyen
(74) *Attorney, Agent, or Firm* — Eric J. Robinson; Robinson Intellectual Property Law Office, P.C.

(57) ABSTRACT

To provide a semiconductor device with reduced power consumption that includes a selection transistor. To provide a semiconductor device capable of high-speed operation without increasing a power supply potential. A buffer circuit connected to a gate line has a function of generating a potential higher than a high power supply potential by using the high power supply potential and outputs the potential in response to a selection signal. Specifically, a bootstrap circuit boosts a high power supply potential that is input to an inverter that is the closest to an output side in the buffer circuit. Further, the bootstrap circuit boosts the potential when the gate line is selected, and does not boost the potential when the gate line is not selected.

20 Claims, 12 Drawing Sheets

(56) References Cited

U.S. PATENT DOCUMENTS

| | | | |
|---|---|---|---|
| 6,788,108 B2 | 9/2004 | Miyake et al. | |
| 6,975,142 B2 | 12/2005 | Azami et al. | |
| 7,049,190 B2 | 5/2006 | Takeda et al. | |
| 7,057,598 B2 | 6/2006 | Azami et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,202,863 B2 | 4/2007 | Kimura et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,521,970 B2 * | 4/2009 | Gupta et al. | 327/112 |
| 7,674,650 B2 | 3/2010 | Akimoto et al. | |
| 7,732,819 B2 | 6/2010 | Akimoto et al. | |
| 8,390,338 B2 * | 3/2013 | Matsui | 327/108 |
| 8,558,584 B2 * | 10/2013 | Draxelmayr et al. | 327/108 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0017681 A1 | 1/2006 | Jang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0224880 A1 | 9/2010 | Kimura | |
| 2011/0140108 A1 | 6/2011 | Kimura et al. | |
| 2011/0215787 A1 | 9/2011 | Shionoiri et al. | |
| 2012/0286263 A1 | 11/2012 | Miyake | |
| 2013/0082760 A1 | 4/2013 | Umezaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-234683 A | 9/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |
| WO | WO-2007/080813 | 7/2007 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Hayashi.R at al., "42.1: Invited Paper: Improved Amorphous In-Ga-Zn-O TFTS", SID Digest '08: SID International Symposium Digest of Technical Papers, May 20, 2008, vol. 39, pp. 621-624.

(56) References Cited

OTHER PUBLICATIONS

Prins.M at al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of SOL-GEL-Derived Zinc Oxide Films by Irradiation with Ultraviolet Lamp", Journal of SOL-GEL Science and Technology, 2003, vol. 26, pp. 181-184.

Osada.T et al., "15.2: Development of Driver-Integrated Panel using Amorphous In-Ga-Zn-Oxide TFT", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generaation Layer", Adv.Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide", Phys.Rev.Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Cho.D et al., "21.2:AL and SN-DOPED Zinc Indium Oxide Thin Film Transistors for AMOLED Back Plane", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09: SID International Digest of Technical Papers, May 31, 2009, pp. 191-193.

Jin.D et al., "65.2: Distinguished Paper: World-Largest (6.5") Flexible Full Color Top Emission AMOLED Display on Plastic Film and its Bending Properties", SID Digest '09: SID International Symposium Digest of Trechnical Papers, May 31, 2009, pp. 983-985.

Sakata.J et al., "Development of 4.0-In. AMOLED Display With Driver Circuit Using Amorphous In-Ga-Zn-Oxide TFTs", IDW '09: Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper: Transparent Amorphous Oxide Semiconductors for High Performance TFT", SID Digest '07: SID International Symposium Digest of Technical Papers, 2007, vol. 38, pp. 1830-1833.

Godo.H et al., "P-9: Numerical Analysis on Temperature Dependence of Characteristics of Amorphous In-Ga-Zn-Oxide TFT", SID Digest '09 SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer", SID Digest '09: SID International Symposium Digest of Technical Papers, May 31, 2009, pp. 284-287.

Miyasaka.M, "Suftla Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1: Invited Paper: Optically Isotropic Nano-Structured Liquid Crystal Composites for Display Applications", SID Digest '09: SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.

Lee.H et al., "Current Status of, Challenges to, and Perspective View of AM-OLED ,", IDW '05: Proceedings of the 13th International Display Workshops, Dec. 7, 2006, pp. 663-666.

Kikuchi.H et al., "62.2: Invited Paper: Fast Electro-Optical Switching in Polymer-Stabilized Liquid Crystalline Blue Phases for Display Application", SID Digest '07: SID International Symposium Digest of Technical Papers, vol. 38, pp. 1737-1740.

(56) References Cited

OTHER PUBLICATIONS

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; FE, GA, or AL; B:MG, MN, FE, NI, CU, or ZN] at Temperatures Over 1000°C,", Journal of Solid State Chemistry, 1985, vol. 60, pp. 382-384.

Kitzerow.H at al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Orita.M et al., "Mechanism of Electrical Conductivity of Transparent InGaZnO4", Phys Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29: Modeling of Amorphous Oxide Semiconductor Thin Film Transistors and Subgap Density of States", SID Digest '08: SID International Symposium Digest of Technical Papers, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep", Zeitschrift fur Kristallographie, 2005, vol.220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. SCI. Technol. B (Journal of Vacuum Science & Technology B), Mar. 1, 2003, vol. 21, No. 2, pp. 800- 803.

Oh.M et al., "Improving the Gate Stability of ZnO Thin-Film Transistors With Aluminum.Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

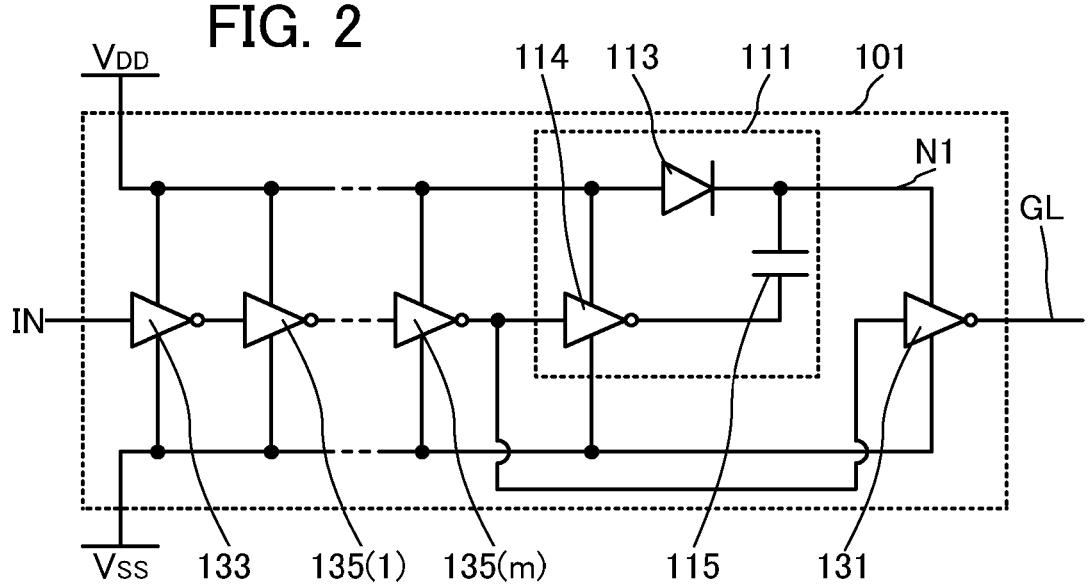

[ Non-Selected State (T0, T2, T4) ]

[ Selected State (T1, T3) ]

SEMICONDUCTOR DEVICE, IMAGE DISPLAY DEVICE, STORAGE DEVICE, AND ELECTRONIC DEVICE

BACKGROUND OF THE INVENTION

1. Field of the Invention

The present invention relates to a semiconductor device. The present invention relates to an image display device. The present invention relates to a storage device.

In this specification, a semiconductor device means all types of devices that can function by utilizing semiconductor characteristics, and a transistor, a semiconductor circuit, a storage device, an imaging device, a display device, an electro-optical device, an electronic device, and the like are all embodiments of semiconductor devices.

2. Description of the Related Art

Semiconductor devices that include a plurality of functional circuits including selection transistors are known. The semiconductor devices are applied to image display devices including a liquid crystal element, an electroluminescent (EL) element, or an electrophoretic element, storage devices including storage elements such as a dynamic random access memory (DRAM) element and a static random access memory (SRAM) element, or the like.

For example, as a display device to which a selection transistor is applied, a display panel using an organic EL medium is disclosed in Patent Document 1.

As the selection transistor, an n-channel transistor is often used. Some of the reasons are as follows: an n-channel transistor can operate at high speed because electrons with high mobility are used as carriers, and is suitable for miniaturization because large current can flow through even a relatively small n-channel transistor.

In recent years, small portable devices such as a mobile phone and a tablet terminal have been developed. Since these devices are powered by a battery, lower power consumption has been desired. In order to make the devices smaller, it has been also desired to reduce the number of circuit elements included in the devices and wirings for connecting the circuit elements as much as possible.

Further, an increased drive frequency of the semiconductor devices has been desired. In an image display device, for example, in order to improve its display quality, it has been examined to increase the number of pixels or perform high-speed display (e.g., at double speed or quad speed). In a storage device, for example, high-speed data writing or data reading has been required.

REFERENCE

Patent Document

[Patent Document 1] Japanese Published Patent Application No. H8-234683

SUMMARY OF THE INVENTION

As described above, an n-channel transistor is often used as a selection transistor included in a functional circuit. When a desired potential is written to a functional element through a selection transistor, a potential that is sufficiently higher than a potential to be written needs to be input to a gate of the selection transistor in order to turn on the selection transistor surely.

For example, in the case where a potential to be input to a gate of the selection transistor is the same as a potential to be written, an on-state resistance of the selection transistor cannot be sufficiently reduced, which causes a delay. Thus, the drive frequency cannot be increased. Moreover, at this time, a potential written through the selection transistor might be decreased from the potential input to the gate of the selection transistor by the threshold voltage of the selection transistor.

Accordingly, it is needed to provide a power supply circuit for generating a potential to be input to the gate and a wiring for supplying the potential from the power supply circuit additionally, which is one factor inhibiting reduction in power consumption or size of an electronic device.

The present invention is made in view of the foregoing technical background. Thus, it is an object of one embodiment of the present invention to provide a semiconductor device with reduced power consumption that includes a selection transistor. Another object is to provide a semiconductor device capable of high-speed operation without increasing a power supply potential.

One embodiment of the present invention solves at least one of the above objects.

In order to achieve any of the above objects, the present invention focuses on a configuration of a buffer circuit connected to a gate line connected to a gate of a selection transistor. The buffer circuit may have a function of generating a potential higher than a high power supply potential by using the high power supply potential, and may output the potential in response to a selection signal.

That is, one embodiment of the present invention is a semiconductor device including a functional circuit including a selection transistor, and a buffer circuit electrically connected to a gate of the selection transistor through a first signal line. The buffer circuit includes first to n-th inverters that are sequentially connected in series and a bootstrap circuit. An input terminal of the first inverter is electrically connected to an input signal line to which a selection signal is input. An output terminal of the n-th inverter is electrically connected to the first signal line. High-potential input terminals of the first to n-th inverters are electrically connected to a second signal line to which a first potential is input. Low-potential input terminals of the first to n-th inverters are electrically connected to a third signal line to which a second potential lower than the first potential is input. The bootstrap circuit outputs a third potential higher than the first potential to the high-potential input terminal of the n-th inverter in response to the selection signal.

In a semiconductor device having such a configuration, a bootstrap circuit boosts a high power supply potential that is input to an inverter that is the closest to an output side among a plurality of inverters included in a buffer circuit. Further, the bootstrap circuit boosts the potential when a selection signal is input to the buffer circuit (when a gate line is selected), and does not boost the potential when the gate line is not selected; thus, an increase in power consumption of the buffer circuit when the gate line is not selected can be suppressed.

With such a buffer circuit, a potential higher than a high power supply potential can be input to a gate line. That is, a potential that is always higher than a potential to be written that is input to the functional circuit through the selection transistor can be input to the gate of the selection transistor. Thus, writing can be performed at high speed.

Note that the functional circuit includes the selection transistor one of a source and a drain of which is electrically connected to a signal line (source line) to which a potential to be written is input, and a functional element electrically connected to the other of the source and the drain of the selection transistor. The functional element is a circuit having a variety of functions in response to a potential input from the source line through the selection transistor.

Examples of the functional circuit are a pixel in an image display device to which a light-emitting element or a liquid crystal element is applied and a memory cell in a storage device such as a DRAM or an SRAM. A portion of the functional circuit other than the selection transistor corresponds to the functional element. Examples of the functional element are a circuit including a light-emitting element, a storage capacitor, a transistor for controlling current, or the like in an image display device to which a light-emitting element is applied; and a capacitor in a DRAM and a flip-flop circuit in an SRAM in a storage device.

Another embodiment of the present invention is a semiconductor device in which the bootstrap circuit includes a diode, a capacitor, and an (n+1)-th inverter. An input terminal of the diode is electrically connected to a second signal line. An output terminal of the diode is electrically connected to a high-potential input terminal of the n-th inverter. An input terminal of the (n+1)-th inverter is electrically connected to an output terminal of the (n−1)-th inverter. A high-potential input terminal of the (n+1)-th inverter is electrically connected to the second signal line. A low-potential input terminal of the (n+1)-th inverter is electrically connected to a third signal line. One terminal of the capacitor is electrically connected to an output terminal of the (n+1)-th inverter. The other terminal of the capacitor is electrically connected to the high-potential input terminal of the n-th inverter.

With the bootstrap circuit having such a configuration in the buffer circuit, the capacitor can be charged when a signal input to the inverter in the bootstrap circuit is a low-level potential, that is, when the gate line is in a non-selected state. At the same time that the signal is changed to a high-level potential, that is, the gate line is changed to be in a selected state, a high power supply potential, which is input to the inverter that is the closest to an output side included in the buffer circuit, can be boosted. Thus, a potential higher than the power supply potential can be input rapidly to the gate line.

For example, a configuration in which the bootstrap circuit boosts the potential of an output terminal of the buffer circuit may be employed. In this case, it is required to charge at least the capacitor in the bootstrap circuit and a gate capacitor of the selection transistor connected to the gate line right after a selection signal is input. Thus, it takes a long time to raise a low potential of the gate line gradually and then make the potential stable. With the above-described configuration, a high potential can be directly input to the gate line, whereby the writing operation can be started in an extremely short time, and thus the drive frequency can be improved.

Another embodiment of the present invention is a semiconductor device in which the inverter includes a CMOS circuit.

Another embodiment of the present invention is a semiconductor device in which the inverter includes an n-channel transistor.

In the case where the inverter included in the buffer circuit includes the CMOS circuit, the power consumption to be reduced. The CMOS circuit can be easily manufactured, which is preferable, because the inverter and another transistor included in the semiconductor device can be formed concurrently. Especially in the case where the inverter includes an NMOS circuit including an n-channel transistor, the inverter and the selection transistor can be formed concurrently, so that the manufacturing process can be simpler.

Another embodiment of the present invention is an image display device including the semiconductor device in which the functional circuit includes a light-emitting element.

Another embodiment of the present invention is an image display device including the semiconductor device in which the functional circuit includes a liquid crystal element.

The above-described buffer circuit can be applied to an image display device to which a light-emitting element such as an organic EL element is applied or a liquid crystal display device to which a liquid crystal element is applied. Thus, an image display device with low power consumption and an increased drive frequency can be provided. Accordingly, an image display device that has a larger number of pixels and is suitable for high-speed display can be provided.

Another embodiment of the present invention is a storage device including the semiconductor device in which the functional circuit includes a storage element.

The above-described buffer circuit can be applied to a storage device including a selection transistor. Accordingly, a storage device that has low power consumption and operates at high speed can be provided. Examples of the storage element are a volatile storage element such as a DRAM or an SRAM and a non-volatile storage element such as a flash memory.

Another embodiment of the present invention is an electronic device including a battery and at least one of the image display device and the storage device.

The image display device or the storage device including the buffer circuit is applied to a portable device powered by a battery, whereby the driving period can be extended, which is preferable. The number of power supply circuits or wirings can be reduced, so that the size of the device can be reduced.

One embodiment of the present invention can provide a semiconductor device with reduced power consumption that includes a selection transistor. A semiconductor device that is capable of operating at high speed can be provided without increasing a power supply potential.

BRIEF DESCRIPTION OF THE DRAWINGS

FIG. 2 illustrates a configuration example of a buffer circuit according to one embodiment of the present invention.

DETAILED DESCRIPTION OF THE INVENTION

Figure 1A:
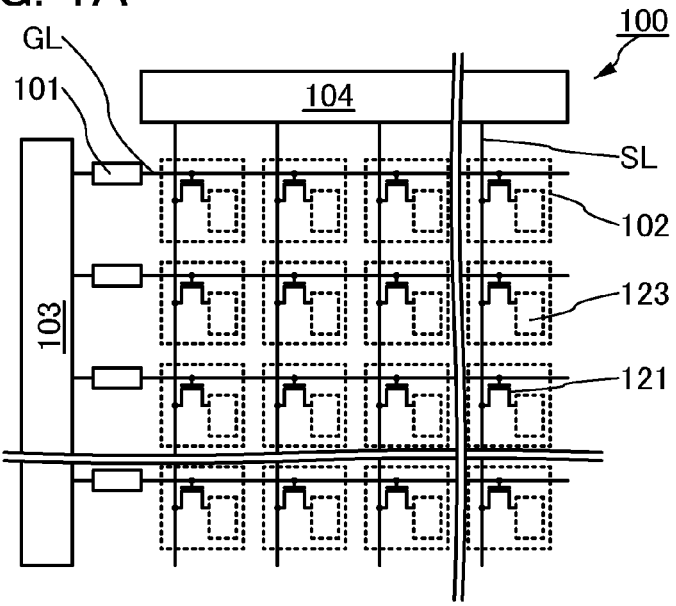
FIGS. 1A and 1B illustrate a configuration example of a display device according to one embodiment of the present invention.

Embodiments are described in detail with reference to the drawings. Note that the invention is not limited to the following description, and it is easily understood by those skilled in the art that various changes and modifications can be made without departing from the spirit and scope of the invention. Therefore, the invention should not be construed as being limited to the description in the following embodiments. Note that in the configurations of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

A transistor is one of a variety of semiconductor elements, and can amplify current or voltage and perform a switching operation for controlling conduction and non-conduction, for example. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification and the like, one of a source and a drain of a transistor is referred to a "first electrode" and the other of the source and the drain is referred to a "second electrode" in some cases. Note that a gate is referred to as a "gate" or a "gate electrode".

Note that in this specification and the like, two electrodes of a diode are referred to as a "first electrode" and a "second electrode" or a "first terminal" and a "second terminal" in some cases. Here, a direction in which current flows from the first electrode to the second electrode is a forward direction of the diode and its opposite direction is an opposite direction of the diode. In addition, one of the electrodes is simply referred to as a "terminal", "one end", "one", or the like in some cases.

In this specification and the like, an electrode on an input side of an inverter is referred to as an "input terminal" or a "first terminal," and an electrode on an output side of an inverter is referred to as an "output terminal" or a "second terminal" in some cases. In addition, one of the electrodes is simply referred to as a "terminal", "one end", "one", or the like in some cases.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric action" include a switching element such as a transistor, a resistor, a coil, a capacitor, and an element with a variety of functions in addition to an electrode and a wiring.

Note that a node in this specification and the like means an element (e.g., a wiring) which enables electric connection between elements included in a circuit. Therefore, a "node to which A is connected" is a wiring that is electrically connected to A and can be regarded as having the same potential as A. Note that even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

Embodiment 1

In this embodiment, a configuration example of an image display device to which a light-emitting element is applied, which is an example of a semiconductor device according to one embodiment of the present invention, and an operation example thereof are described with reference to drawings.

Configuration Example

FIG. 1A is a schematic diagram of a display device 100.

The display device 100 includes a plurality of pixels 102 that is arranged in a matrix, a first driver circuit 103, and a second driver circuit 104.

Each of the pixels 102 includes at least a selection transistor 121 and a functional element 123. The functional element 123 is connected to a second electrode of the selection transistor 121 and includes at least a light-emitting element.

Gates of the selection transistors 121 of a plurality of pixels 102 that is positioned adjacent in a row of all the pixels 102 are electrically connected to a gate line GL. Each of a plurality of gate lines GL is connected to a corresponding buffer circuit 101. The buffer circuits 101 are electrically connected to the first driver circuit 103.

Further, first electrodes (either source electrodes or drain electrodes) of the selection transistors 121 of a plurality of pixels 102 that is positioned adjacent in a column of all the pixels 102 are electrically connected to a source line SL. A plurality of source lines SL is each electrically connected to the second driver circuit 104.

The first driver circuit 103 transmits a selection signal to the plurality of buffer circuits 101. A gate line GL connected to the buffer circuit 101 to which the selection signal is input is selected, whereby the plurality of pixels 102 that is positioned adjacent in a row is selected, so that the selection transistors 121 of the pixels 102 are turned on.

The second driver circuit 104 selectively transmits a writing signal to the plurality of source lines SL. Here, in response to the writing signal, writing can be performed on a plurality of pixels 102 that is electrically connected to the gate line GL selected by the first driver circuit 103.

Figure 1B:
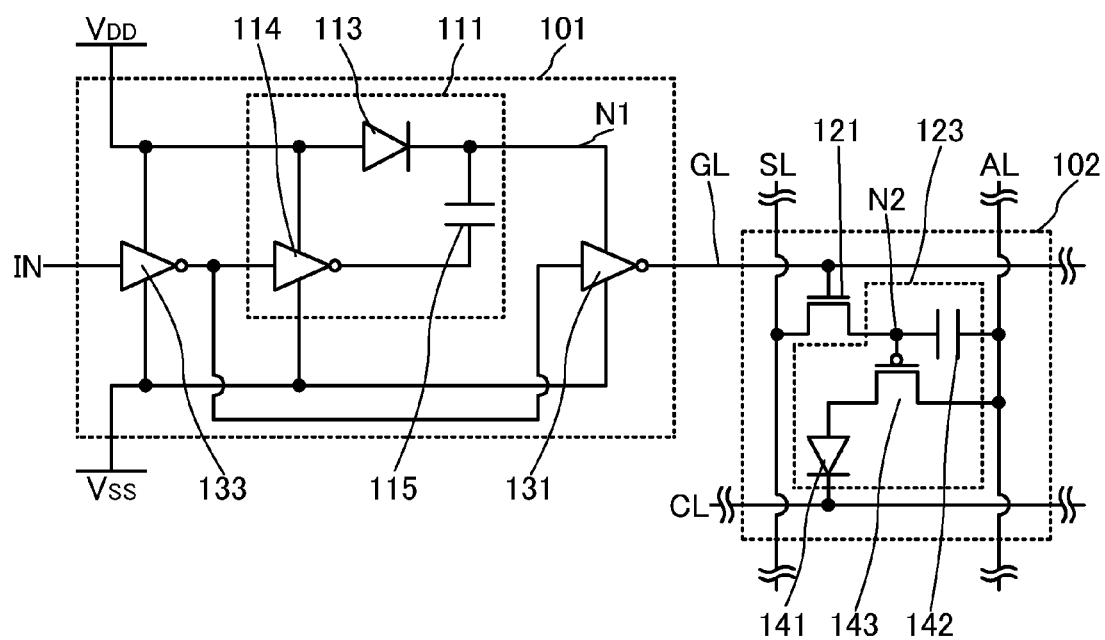

FIG. 1B is a circuit diagram illustrating the buffer circuit 101 and the pixel 102 electrically connected thereto, which are extracted from FIG. 1A.

A high power supply potential VDD and a low power supply potential VSS are input to the buffer circuit 101. A selection signal IN output from the first driver circuit 103 is input to an input side of the buffer circuit 101. The gate line GL is electrically connected to an output side of the buffer circuit 101.

In response to the selection signal IN, the buffer circuit 101 can generate a potential higher than the high power supply potential VDD and can output the potential to the gate line GL.

The buffer circuit includes at least two inverters that are connected in series (an inverter 131 and an inverter 133) and a bootstrap circuit 111.

The selection signal IN is input to an input terminal of the inverter 133. The high power supply potential VDD is input to a high-potential input terminal of the inverter 133. The low power supply potential VSS is input to a low-potential input terminal of the inverter 133. An output terminal of the inverter 133 is electrically connected to the bootstrap circuit 111 and an input terminal of the inverter 131.

An output terminal of the inverter 131 is electrically connected to the gate line GL. A high-potential input terminal of the inverter 131 is electrically connected to the bootstrap circuit 111. The low power supply potential VSS is input to a low-potential input terminal of the inverter 131.

The high power supply potential VDD and the low power supply potential VSS are input to the bootstrap circuit 111.

Here, in response to a signal input from the inverter 133, the bootstrap circuit 111 can output a potential higher than the high power supply potential VDD to a node (node N1) that is connected to the high-potential input terminal of the inverter 131.

The bootstrap circuit 111 includes a diode 113, an inverter 114, and a capacitor 115.

The high power supply potential VDD is input to a first terminal of the diode 113, and a second terminal of the diode 113 is electrically connected to one electrode of the capacitor 115 and the high-potential input terminal of the inverter 131. An input terminal of the inverter 114 is electrically connected to the output terminal of the inverter 133. An output terminal of the inverter 114 is electrically connected to the other electrode of the capacitor 115. The high power supply potential VDD is input to a high-potential input terminal of the inverter 114. The low power supply potential VSS is input to a low-potential input terminal of the inverter 114.

Here, a configuration in which two inverters that are connected in series and the bootstrap circuit 111 are included in the buffer circuit 101 is illustrated in FIG. 1B; however, three or more of inverters may be connected in series.

FIG. 2 illustrates a configuration in which m inverters (an inverter 135(1) to an inverter 135(m)) are connected in series between the inverter 133 and the bootstrap circuit 111. Here, it is preferable that the number of m inverters that are connected in series be even.

Further, the current supply capability of the plurality of inverters that is connected in series is preferably increased gradually from an input side to an output side, that is, from the inverter 133 toward the inverter 135.

The operation of the buffer circuit 101 is described later in detail.

FIG. 1B illustrates an example of a pixel.

The pixel 102 includes the selection transistor 121 and the functional element 123. The functional element 123 includes a light-emitting element 141, a capacitor 142, and a transistor 143. The gate line GL, the source line SL, an anode line AL, and a cathode line CL are electrically connected to the pixel 102.

A gate of the selection transistor 121 is electrically connected to the gate line GL. A first electrode of the selection transistor 121 is electrically connected to the source line SL. A second electrode of the selection transistor 121 is electrically connected to one electrode of the capacitor 142 and a gate of the transistor 143. The other electrode of the capacitor 142 is electrically connected to the anode line AL. A first electrode of the transistor 143 is electrically connected to one electrode of the light-emitting element 141. A second electrode of the transistor 143 is electrically connected to the anode line AL. The other electrode of the light-emitting element 141 is electrically connected to the cathode line CL.

Here, a node connected to the second electrode of the selection transistor 121, the one electrode of the capacitor 142, and the gate of the transistor 143 is referred to as a node N2.

A potential higher than a potential input to the cathode line CL is input to the anode line AL. Specifically, potentials of the anode line AL and the cathode line CL are set in order to make a potential difference that causes light emission of the light-emitting element 141. For example, a high power supply potential VDD is input to the anode line AL, and a low power supply potential VSS or a potential lower than the low power supply potential VSS is input to the cathode line CL.

The transistor 143 is a p-channel transistor. The transistor 143 is provided for controlling current flowing in the light-emitting element 141.

The capacitor 142 is provided for holding a potential written in the node N2 through the selection transistor 121. The potential held in the node N2 controls the amount of the current flowing through the transistor 143, so that light emission of the light-emitting element 141 is controlled.

The light-emitting element 141 is an element that emits light by application of voltage between a pair of electrodes. A typical example thereof is an organic EL element in which a layer containing a light-emitting organic compound is interposed between a pair of electrodes. Further, a variety of light-emitting elements such as an LED element and an inorganic EL element in which a layer containing a light-emitting inorganic compound is interposed between a pair of electrodes can be used.

In this embodiment, the pixel 102 has a configuration combining two transistors, one capacitor, and one light-emitting element; however the pixel 102 can employ not only this configuration but also various configurations. For example, a correction circuit for variation in electrical characteristics of a transistor may be provided. Further, as the transistor 143, a p-channel transistor is used in the above configuration; however, an n-channel transistor may be used as the transistor 143.

Here, an example of the buffer circuit 101 including transistors is described.

Figure 3A:
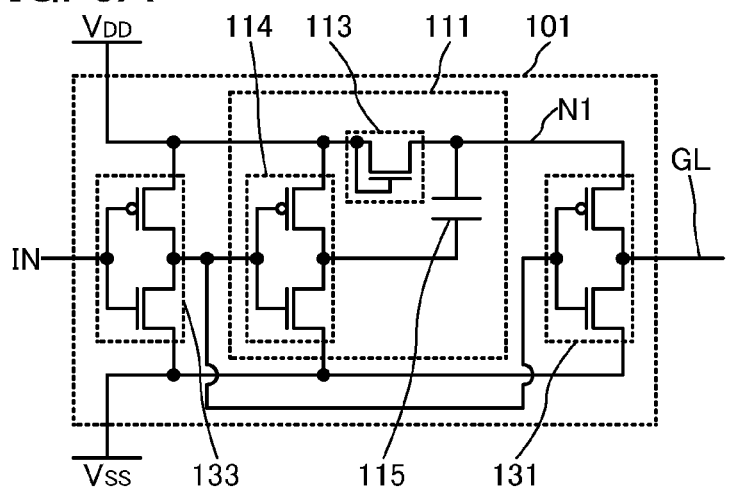
FIGS. 3A to 3C each illustrate a configuration example of a buffer circuit according to one embodiment of the present invention.

FIG. 3A illustrates an example in which CMOS circuits each of which includes an n-channel transistor and a p-channel transistor in combination are used as inverters (the inverter 131, the inverter 133, and the inverter 114) included in the buffer circuit 101.

A variety of elements having diode characteristics, such as a PN junction diode, can be used as the diode 113. Here, as the diode 113, an n-channel transistor having its gate electrically connected to one of its own source or drain is used.

In such a manner, the buffer circuit 101 is formed using transistors, so that a configuration similar to any of the configurations of the transistors included in the first driver circuit 103, the second driver circuit 104, and the pixel 102 can be used for the transistors of the buffer circuit 101. Thus, the buffer circuit 101, the first driver circuit 103, the second driver circuit 104, and the pixel 102 can be manufactured through a common manufacturing process, which is preferable.

In the case where a CMOS circuit is applied to the inverters, leakage current of the inverters can be reduced, so that a buffer circuit with low power consumption can be provided.

Figure 3B:
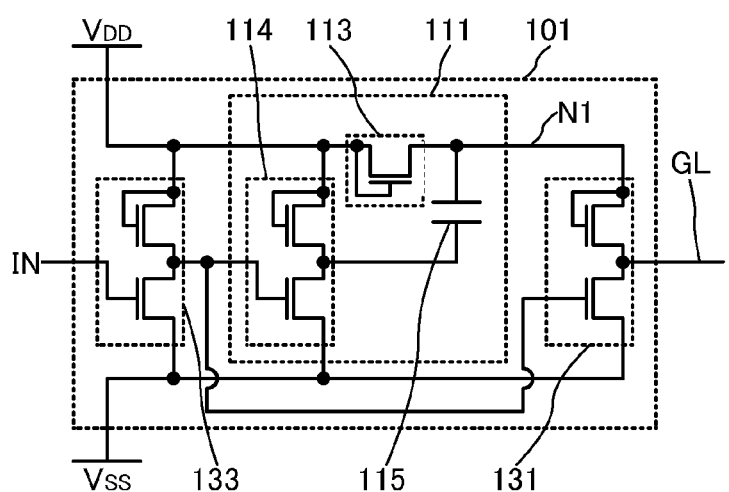
Figure 3C:
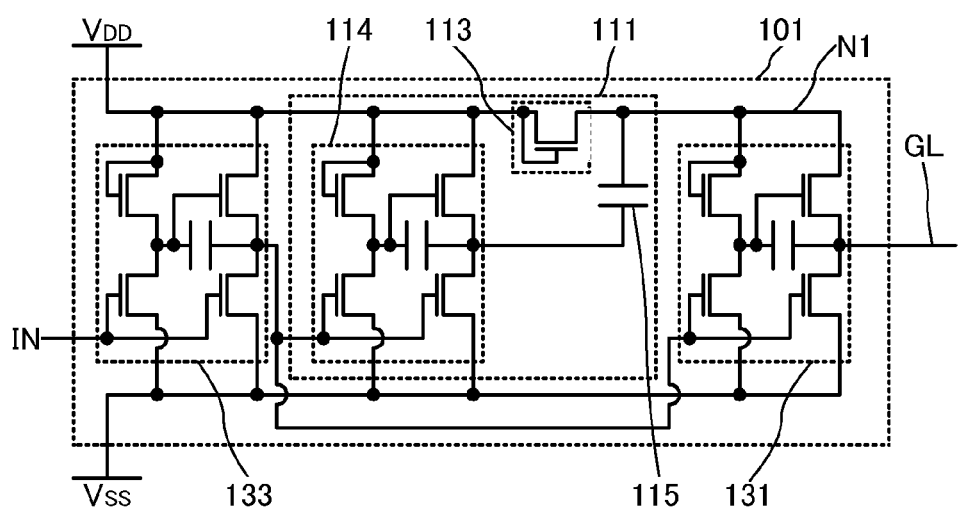

FIGS. 3B and 3C each illustrate an example in which only n-channel transistors are used for transistors of the buffer circuit 101.

FIG. 3B illustrates a configuration including inverters each of which includes two n-channel transistors in combination. With such a configuration, the configuration of the buffer circuit 101 can be simpler, which is preferable.

FIG. 3C illustrates a configuration including inverters each of which includes four n-channel transistors and one capacitor in combination. With such a configuration of inverters, the output potential can be stable, which is preferable.

By forming the buffer circuit using only transistors having the same conductivity type in the above-described manner, the manufacturing process can be simpler, which is preferable. For example, in an image display device to which a transistor including an oxide semiconductor as a semiconductor layer is applied, it is preferable to form a pixel portion and the buffer circuit concurrently on the same substrate.

That is the description of the configuration examples of the display device 100.

Operation Example

An operation example of the display device 100 is described below.

Figure 4A:
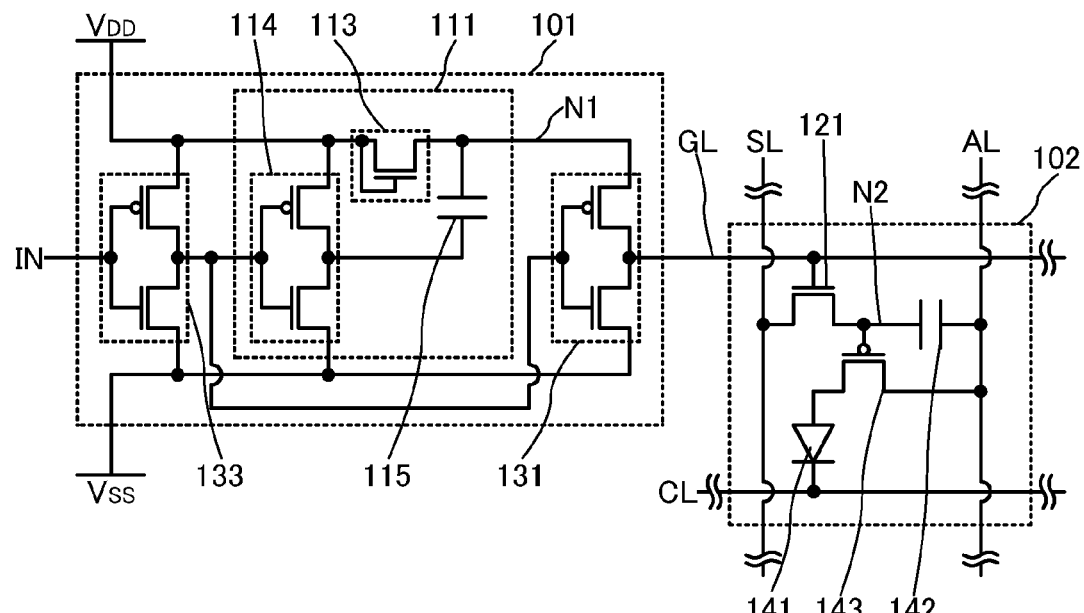
FIGS. 4A and 4B illustrate an example of a driving method of a display device according to one embodiment of the present invention.

The operation of the display device 100 is described here using the buffer circuit 101, which is illustrated in FIG. 4A, to which the above-described CMOS circuit is applied and one of the pixels 102, which is illustrated in FIG. 4A, that is electrically connected to the buffer circuit 101 through a gate line GL. Here, the buffer circuit 101 illustrated in FIG. 4A has a configuration similar to that of the buffer circuit 101 illustrated in FIG. 3A. The pixel 102 illustrated in FIG. 4A has a configuration similar to that of the pixel 102 illustrated in FIG. 1B.

Figure 4B:
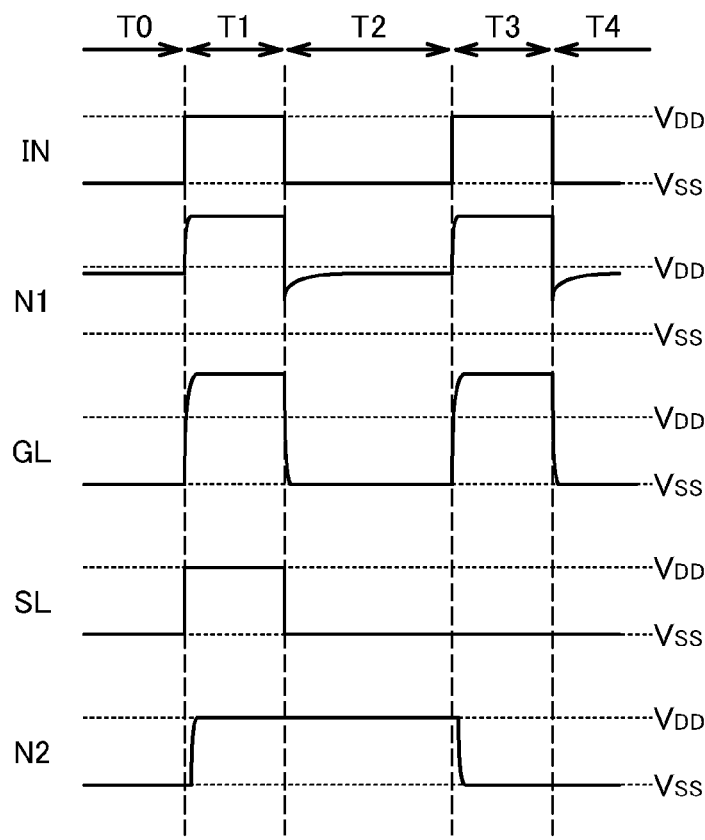

FIG. 4B is a timing chart showing potential changes over time of a selection signal IN, a node N1, the gate line GL, a source line SL, and a node N2 in FIG. 4A.

A period T0, a period T2, and a period T4 in FIG. 4B are periods during which a low-level potential is input as the selection signal IN, that is, periods during which the gate line GL is in a non-selected state. In contrast, a period T1 and a period T3 are periods during which a high-level potential is input as the selection signal IN, that is, periods during which the gate line GL is selected.

Figure 5A:
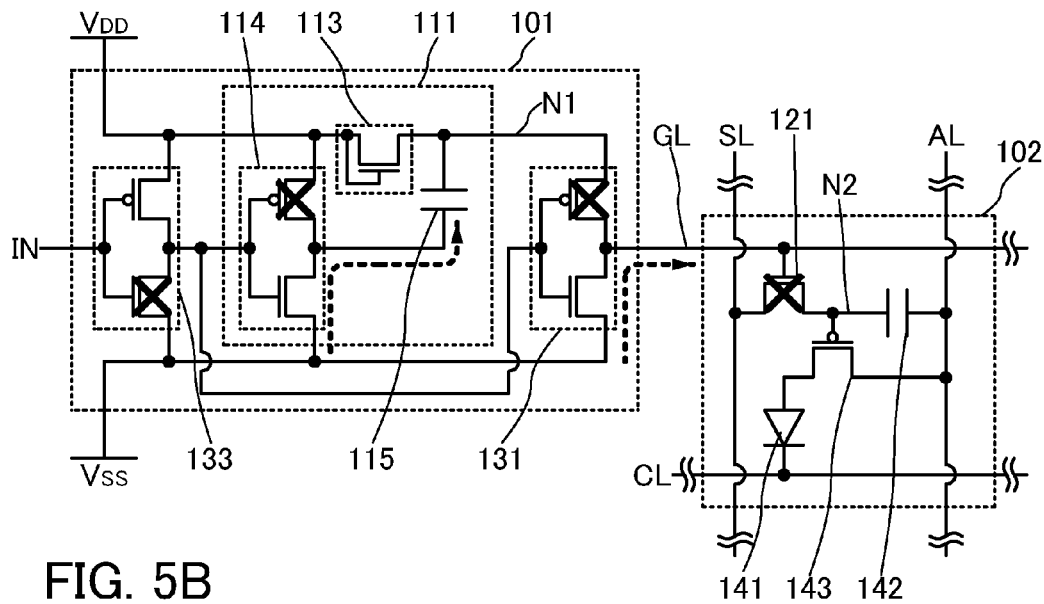
FIGS. 5A and 5B illustrate an example of a driving method of a display device according to one embodiment of the present invention.

First, an operation in the period T0 during which the gate line GL is in a non-selected state is described with reference to FIG. 4B and FIG. 5A.

In the period T0, a low-level potential is input to the inverter 133 as the selection signal IN. Accordingly, a high power supply potential VDD is input to the inverter 114 and the inverter 131 which are connected to an output of the inverter 133.

Here, the potential of one electrode of the capacitor 115 in the bootstrap circuit 111, that is, the potential of the node N1 is a potential that is input through the diode 113 and is close to the high power supply potential VDD. More specifically, the potential of the node N1 is lower than the high power supply potential VDD by a threshold voltage of the diode 113.

In contrast, a low power supply potential VSS is input to the other electrode of the capacitor 115 through the inverter 114.

Accordingly, in the period T0 during which the gate line GL is in a non-selected state, a state in which in the capacitor 115 is charged in response to the potential difference is held.

In the period T0, the low power supply potential VSS is input to the gate line GL connected to an output of the inverter 131. At this time, the selection transistor 121 in each pixel 102 connected to the gate line GL is in an off state, so that the potential of the node N2 is not changed regardless of the potential of the source line SL.

Figure 5B:
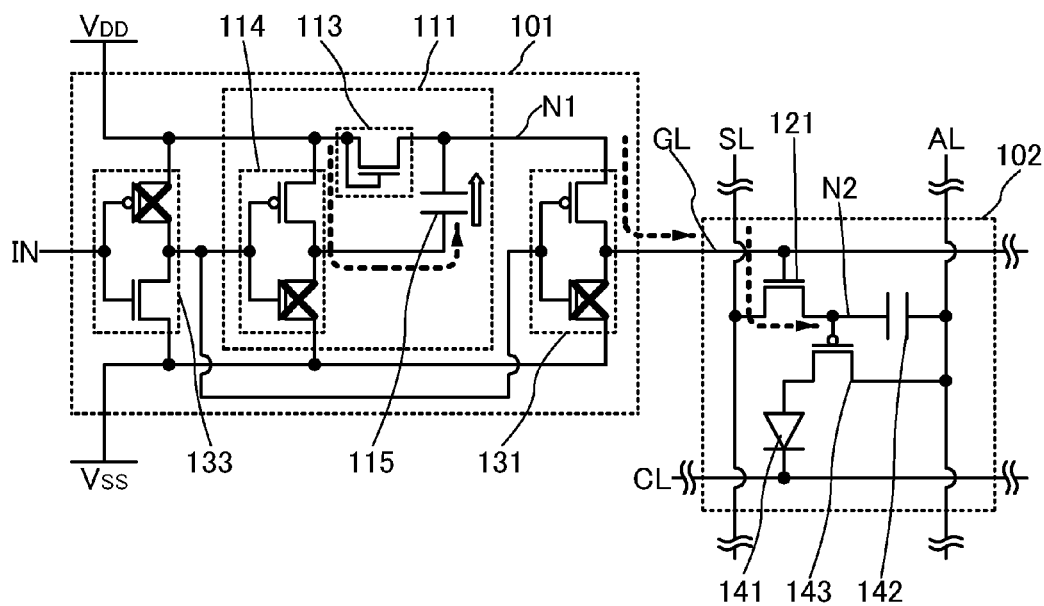

Accordingly, an operation of the period T1 during which the gate line GL is in a selected state, which starts after the period T0, is described with reference to FIG. 4B and FIG. 5B.

When the period T1 starts, a high-level potential is input to the inverter 133 as a selection signal IN. Accordingly, the low power supply potential VSS is input to the inverter 114 and the inverter 131 which are connected to the output of the inverter 133.

Accordingly, an output of the inverter 114 is inverted, whereby the potential of the other electrode of the capacitor 115 is changed from the low power supply potential VSS to the high power supply potential VDD in an extremely short period.

Here, since the potential difference is generated between the both electrodes of the capacitor 115 in the period T0, the increase in the potential of the other electrode of the capacitor 115 makes the potential of the one electrode of the capacitor 115, that is, the potential of the node N1 to be increased to a potential higher than the high power supply potential VDD.

Accordingly, a potential output to the gate line GL through the inverter 131 becomes a potential higher than the high power supply potential VDD.

It is assumed here that a potential equal to the high power supply potential VDD is input as a writing signal input to the source line SL in the period T1.

A potential that is sufficiently higher than the high power supply potential VDD is input to the gate of the selection transistor 121; thus, the on-state resistance is extremely low, and a potential that is very close to the potential input to the source line SL can be written to the node N2. In addition, current flowing from the source line SL to the capacitor 142 through the selection transistor 121 can be made large, so that the time for charging the capacitor 142, that is, the time required for writing can be extremely shortened.

Then, an operation of the period T2 during which the gate line GL is in a non-selected state, which starts after the period T1 to, is described.

When the period T2 starts, a low-level potential is input to the inverter 133 as the selection signal IN again. The output of the inverter 133 is inverted, whereby the outputs of the inverter 114 and the inverter 131 are inverted, so that the inverter 114 and the inverter 131 output the low power supply potential VSS.

Here, in the period T1, part of the charge accumulated in the capacitor 115 is lost as current flowing in the gate line GL; thus, the potential of the node N1 right after the period T2 starts is lower than the potential of the node N1 at the time when the period T1 is about to start.

Right after the period T2 starts, charge of the capacitor 115 starts again, so that the potential of the node N1 rises. Here, in the period T2 during which the gate line GL is in a non-selected state, writing operation is performed sequentially on the pixels 102 connected to the other gate lines GL. Thus, the length of the period T2 during which one gate line GL is in a non-selected state is sufficiently longer than the length of the period T1 during which the gate line GL is selected. Thus, the charging of the capacitor 115 in the buffer circuit 101 can be completed in the period during which the gate line GL is in a non-selected state, whereby a period for boosting does not need to be additionally provided; thus, an efficient operation is possible.

Then, the period T2 proceeds to the period T3, which makes the gate line GL in a selected state again.

It is assumed here that in the period T3, a potential that is equal to the low power supply potential VSS is input as a writing signal input to the source line SL.

Also in this case, a potential higher than the high power supply potential VDD is input to the gate of the selection transistor 121 and thus the on-state resistance is reduced, so that the period required for discharge from the node N2 to the source line SL through the selection transistor 121 can be extremely shortened.

After that, the period T3 proceeds to the period T4, which makes the gate line GL in a non-selected state again.

In the above-described manner, writing operation is performed sequentially on the pixels 102.

That is the description of the operation example of the display device 100.

Note that here, the display device including a light-emitting element is described as an example of the display device 100; however, this embodiment can also be applied to a display device including a liquid crystal element. An example of the configuration of the pixel 102 for a display device including a liquid crystal element is illustrated in FIG. 6.

Figure 6:
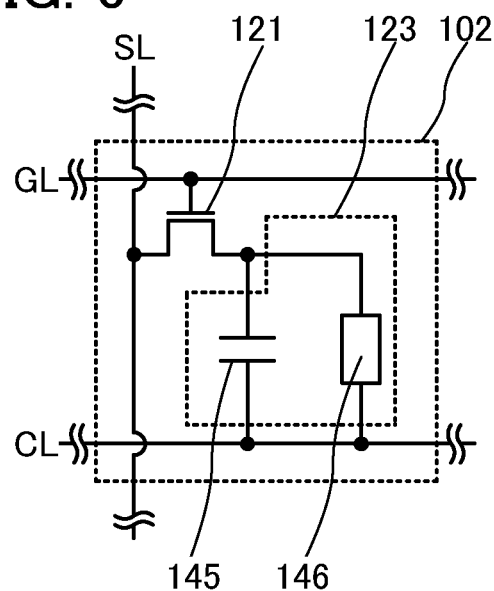
FIG. 6 illustrates a configuration example of a pixel according to one embodiment of the present invention.

The pixel 102 illustrated in FIG. 6 includes the selection transistor 121, a capacitor 145, and a liquid crystal element 146. Further, a gate line GL, a source line SL, and a cathode line CL are electrically connected to the pixel 102. Note that here, the configuration including the capacitor 145 and the liquid crystal element 146 corresponds to the functional element 123.

A second electrode of the selection transistor 121 is electrically connected to one electrode of the capacitor 145 and one electrode of the liquid crystal element 146. The other electrode of the capacitor 145 and the other electrode of the liquid crystal element 146 are electrically connected to the cathode line CL.

The liquid crystal element 146 is an element in which a liquid crystal material is interposed between a pair of electrodes.

In such a pixel 102 to which the liquid crystal element 146 is applied, as well as the above, a predetermined potential is written from the source line SL to the one electrode of the liquid crystal element 146 in a period during which the selection transistor 121 is selected to be in an on state; thus display can be performed at a predetermined gray scale level.

Also in the case where an electrophoretic element or a twisting ball is used instead of the liquid crystal element 146, a similar configuration can be employed.

That is the description of the display device including a liquid crystal element.

In such a semiconductor device including the buffer circuit 101, a period required for writing, including a period prior to the start of the writing, can be extremely shortened; thus, a semiconductor device whose drive frequency is high can be obtained. Further, a boost operation of the potential of the gate line GL connected to the buffer circuit 101 is performed only when the gate line GL is in a selected state, and is not performed when the gate line GL is in a non-selected state; thus, a semiconductor device in which power consumption is reduced can be obtained.

This embodiment can be combined with any of the other embodiments and example described in this specification as appropriate.

Embodiment 2

One embodiment of the present invention can be applied to a variety of storage devices such as a DRAM or an SRAM. In this embodiment, a configuration example of a storage device that is one embodiment of the present invention is described with reference to drawings.

In a storage device according to one embodiment of the present invention, the pixel including a selection transistor described in Embodiment 1 is replaced with a memory cell that is capable of storing data. A configuration of a memory cell that can be applied to a storage device according to one embodiment of the present invention is described below.

Although some components (such as a wiring) in a display device are generally called differently from ones having the same function in a storage device, common names are used for them here, following the names used in Embodiment 1.

Configuration Example 1

In this configuration example, a storage device including a DRAM element is described.

Figure 7A:
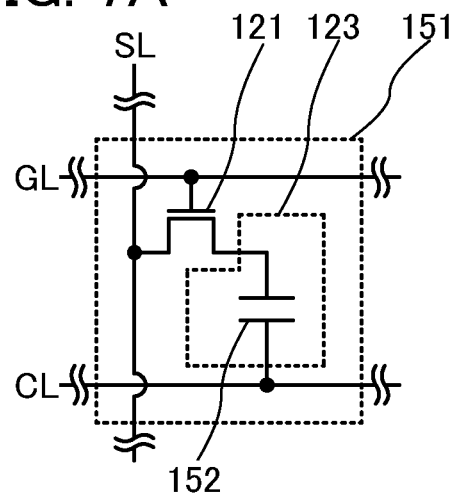
FIGS. 7A and 7B each illustrate a configuration example of a memory cell according to one embodiment of the present invention.

FIG. 7A illustrates a memory cell 151 to which a DRAM element is applied. The memory cell 151 includes the selection transistor 121 and a capacitor 152. Here, the configuration including the capacitor 152 corresponds to the functional element 123.

A second electrode of the selection transistor 121 is electrically connected to one electrode of the capacitor 152. The other electrode of the capacitor 152 is electrically connected to a cathode line CL.

The memory cell 151 can store data by holding a potential written to the one electrode of the capacitor 152 through the selection transistor 121.

The data stored in the memory cell 151 can be read by detecting a potential change of a source line SL at the time of turning on the selection transistor 121 with a sense amplifier or the like. Note that the data held in the memory cell 151 is lost in reading in the case of a DRAM; thus, it is preferable that the data be written again to the same or another memory cell after the reading.

In the selection transistor 121, a single crystal semiconductor, a polycrystalline semiconductor, a microcrystalline semiconductor, an amorphous semiconductor, or the like can be used as a semiconductor in which a channel is formed. Examples of a semiconductor material are silicon, germanium, silicon germanium, silicon carbide, and gallium arsenide. A transistor including such a semiconductor material can operate at sufficiently high speed; thus, reading of stored data can be performed at high speed, for example. In other words, high-speed operation of the semiconductor device can be obtained.

With such a configuration, the number of wirings can be reduced, so that a circuit configuration can be simpler. In addition, the memory cell includes one transistor and one capacitor, and thus can be reduced in size.

In the selection transistor 121, an oxide semiconductor can be used as a semiconductor in which a channel is formed. An oxide semiconductor has an energy gap that is as wide as 3.0 eV or more and thus in a transistor obtained by processing an oxide semiconductor under appropriate conditions, a leakage current between the source and the drain in an off state (off-state current) can be extremely low. Thus, a semiconductor device with low power consumption can be provided.

An oxide semiconductor to be used preferably includes at least indium (In) or zinc (Zn). In particular, In and Zn are preferably contained. As a stabilizer for reducing variation in electrical characteristics of a transistor using the oxide semiconductor, gallium (Ga) is preferably additionally contained. Tin (Sn) is preferably contained as a stabilizer. In addition, as a stabilizer, one or more selected from hafnium (Hf), zirconium (Zr), titanium (Ti), scandium (Sc), yttrium (Y), and an lanthanoid element (such as cerium (Ce), neodymium (Nd), or gadolinium (Gd), for example) is preferably contained.

Preferably, a CAAC-OS (c-axis aligned crystalline oxide semiconductor) film is used as the oxide semiconductor film.

The CAAC-OS film is not completely single crystal nor completely amorphous. The CAAC-OS film is an oxide semiconductor film with a crystal-amorphous mixed phase structure where crystal parts are included in an amorphous phase.

Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

There are three methods for forming a CAAC-OS film when the CAAC-OS film is used as the oxide semiconductor film.

The first method is to form an oxide semiconductor film at a temperature higher than or equal to 200° C. and lower than or equal to 450° C. to form, in the oxide semiconductor film, crystal portions in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

With the use of the CAAC-OS film in a transistor, change in electrical characteristics of the transistor due to irradiation with visible light or ultraviolet light is small. Thus, the transistor has high reliability.

After formation of the oxide semiconductor film, it is preferable that dehydration treatment (dehydrogenation treatment) be performed to remove hydrogen or moisture from the oxide semiconductor film, so that the oxide semiconductor film is highly purified so as to include as few impurities as possible, and oxygen whose amount is reduced in the dehydration treatment (dehydrogenation treatment) be added to the oxide semiconductor or oxygen be supplied excessively to fill the oxygen vacancies in the oxide semiconductor film. In this specification and the like, supplying oxygen to an oxide semiconductor film may be expressed as oxygen adding treatment.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an electrically i-type (intrinsic) or substantially i-type oxide semiconductor film. The oxide semiconductor film formed in such a manner includes extremely few (close to zero) carriers derived from a donor, and the carrier concentration thereof is lower than $1 \times 10^{14}$/cm$^3$, preferably lower than $1 \times 10^{12}$/cm$^3$, further preferably lower than $1 \times 10^{11}$/cm$^3$, still further preferably lower than $1.45 \times 10^{10}$/cm$^3$.

The transistor including the oxide semiconductor layer that is highly purified by sufficiently reducing the hydrogen concentration, and in which defect levels in the energy gap due to oxygen vacancies are reduced by sufficiently supplying oxygen can achieve excellent off-state current characteristics. For example, the off-state current (per unit channel width (1 μm) here) at room temperature (25° C.) is 100 zA/mm (1 zA (zeptoampere) is $1 \times 10^{-21}$ A) or less, preferably 10 zA/mm or less. The off-state current at 85° C. is 100 zA/μm ($1 \times 10^{-19}$ A/μm) or less, preferably 10 zA/μm ($1 \times 10^{-20}$ A/μm) or less. In this manner, the transistor that has extremely favorable off-state current characteristics can be obtained with the use of an i-type (intrinsic) or substantially i-type oxide semiconductor layer.

Since the transistor including an oxide semiconductor has an extremely low off-state current, the potential of the capacitor 152 can be held for an extremely long time by turning off the selection transistor 121. Therefore, a refresh operation is not necessary or the interval between refresh operations can be much longer than conventional DRAM.

That is the description of the storage device including a DRAM element.

Configuration Example 2

In this configuration example, a storage device including an SRAM element is described.

Figure 7B:
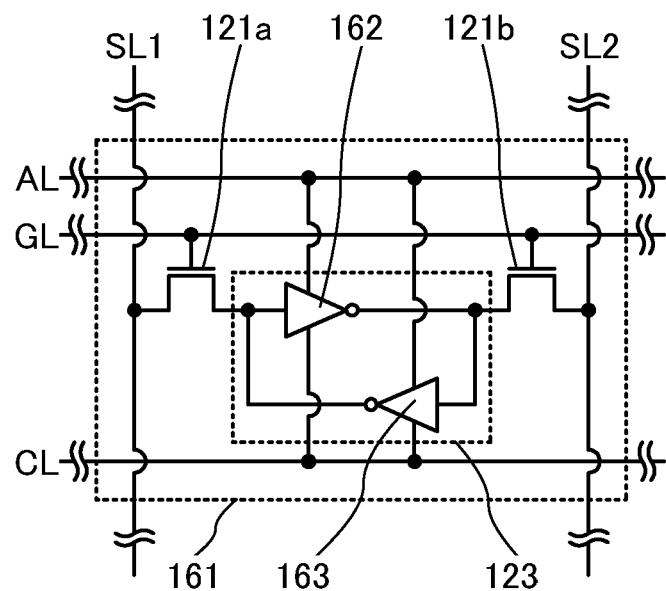

FIG. 7B illustrates a memory cell 161 to which an SRAM element is applied. The memory cell 161 includes two selection transistors (the selection transistor 121a and the selection transistor 121b) and two inverters (an inverter 162 and an inverter 163). The memory cell 161 is electrically connected to a gate line GL, two source lines (a source line SL1 and a source line SL2), an anode line AL, and a cathode line CL. The configuration including the two inverters corresponds to the functional element 123.

A gate of the selection transistor 121a is electrically connected to the gate line GL. A first electrode of the selection transistor 121a is electrically connected to the source line SL1. A second electrode of the selection transistor 121a is electrically connected to an input terminal of the inverter 162 and an output terminal of the inverter 163. A second electrode of the selection transistor 121b is electrically connected to the source line SL2. A first electrode of the selection transistor 121b is electrically connected to an output terminal of the inverter 162 and an input terminal of the inverter 163. High-potential input terminals of the inverter 162 and the inverter 163 are electrically connected to the anode line AL. Low-potential input terminals of the inverter 162 and the inverter 163 are electrically connected to the cathode line CL. The output terminal of the inverter 162 is connected to the input terminal of the inverter 163, and the input terminal of the inverter 162 is connected to the output terminal of the inverter 163 so as to form an inverter loop.

Data is written by inputting a writing signal from the source line SL1 through the selection transistors 121a connected to the source lines SL1 and inputting a writing signal from the source line SL2 through the selection transistors 121b connected to the source lines SL2. At this time, a signal that is inverted from that of the source line SL2 is input to the source line SL1.

For example, the selection transistor 121a and the selection transistor 121b are made to be on, a high-level potential is input from the source line SL1 through the selection transistor 121a and a low-level potential is input from the source line SL2 through the selection transistor 121b, whereby data is written. The potential of a node connected to the input terminal of the inverter 162 is changed to the high-level potential, whereby the potential of a node connected to the output terminal of the inverter 162 is changed to the low-level potential. By holding this state, data can be stored.

Data is read by detecting a potential output to the source line SL1 through the selection transistors 121a connected to the source lines SL1 and detecting a potential output to the source line SL2 through the selection transistors 121b connected to the source lines SL2.

For example, when the selection transistor 121a and the selection transistor 121b are made to be on, a potential output to the source line SL1 through the selection transistors 121a and a potential output to the source line SL2 through the selection transistors 121b are detected, whereby data is read.

Such a configuration does not need a capacitor in the memory cell, so that the writing operation and the reading operation can be performed at extremely high speed.

That is the description of the storage device including an SRAM element.

Configuration Example 3

In this configuration example, a storage device that has a different configuration from the above configuration examples is described.

Figure 8A:
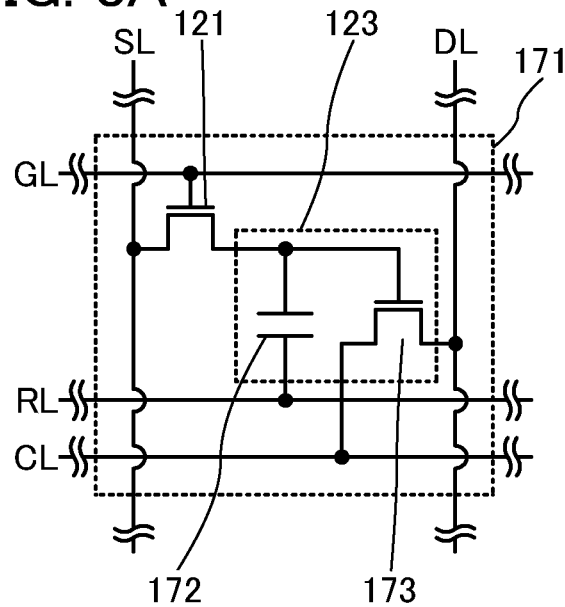
FIGS. 8A and 8B each illustrate a configuration example of a memory cell according to one embodiment of the present invention.

FIG. 8A illustrates a memory cell 171 of this configuration example. The memory cell 171 includes the selection transistor 121, a capacitor 172, and a transistor 173. The memory cell 171 includes, as well as a gate line GL, a source line SL, and a cathode line CL, a data line DL for outputting read data and a read line RL for selecting a memory cell from which data is to be read. Here, the configuration including the capacitor 172 and the transistor 173 corresponds to a functional element 123.

A gate of the selection transistor 121 is electrically connected to the gate line GL. A first electrode of the selection transistor 121 is electrically connected to the source line SL. A second electrode of the selection transistor 121 is electrically connected to one electrode of the capacitor 172 and a gate of the transistor 173. The other electrode of the capacitor 172 is electrically connected to the read line RL. A first electrode of the transistor 173 is electrically connected to the cathode line CL. A second electrode of the transistor 173 is electrically connected to the data line DL.

Data is written by inputting a potential from the source line SL to a node connected to the one electrode of the capacitor 172 through the selection transistor 121.

Data is read by detecting the potential of the data line DL with a sense amplifier or the like. For example, before performing a reading operation, it is preferable to charge the potential of the data line DL to a high-level potential in advance. Here, in the case of writing a high-level potential to the node, the transistor 173 is made to be on, so that a potential close to the potential of the cathode line CL is output to the data line DL. In contrast, in the case of writing a low-level potential to the node, the transistor 173 is made to be off; so that, the potential of the data line DL is not changed, that is, remains the high-level potential.

Here, a potential (e.g., a negative power supply potential) that is lower than the low-level potential is supplied to the read line RL in the memory cell 171 from which data is not read among the plurality of memory cells 171 that is connected to one data line DL. Accordingly, in the memory cell 171 from which data is not read, the transistor 173 is always off regardless of the potential written to the node connected to the one electrode of the capacitor 172. Thus, the memory cell 171 from which data is not read is made to be in a non-selected state, so that only data of a target memory cell can be read.

Figure 8B:
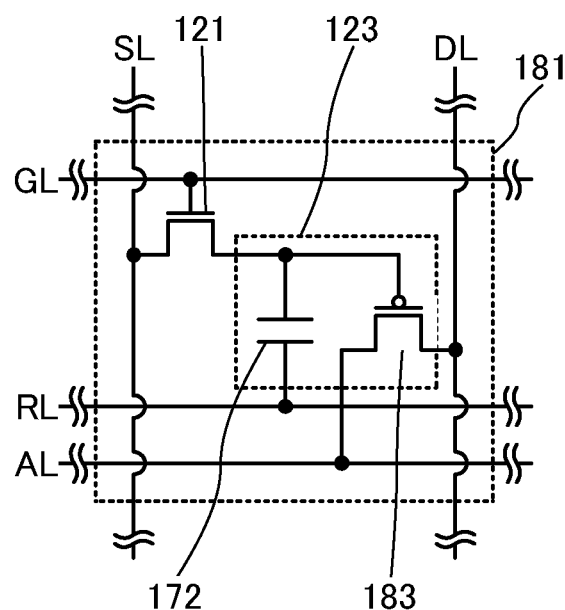

Here, as illustrated in FIG. 8B, a p-channel transistor can be used as the transistor 173, so that reading can be performed without using a negative power supply potential.

A memory cell 181 illustrated in FIG. 8B has a different configuration from that of the memory cell 171 in that a p-channel transistor 183 is used instead of the transistor 173 and in that an anode line AL is used instead of the cathode line CL.

For data reading, the potential of a data line DL is made to be a low-level potential before data reading starts. In the case where a high-level potential is written to a node connected to one electrode of the capacitor 172, the transistor 183 is made to be in an off state, so that the potential of the data line DL is not changed, that is, remains the low-level potential. In contrast, in the case where a low-level potential is written to the node, the transistor 183 is made to be in an on state, so that a potential close to the potential of the anode line AL is output to the data line DL.

In contrast, in another memory cell 181 from which data is not read, a high-level potential is supplied to the read line RL. Then, the transistor 183 is made to be in an off state regardless of the potential written to the node, so that the memory cell 181 can be in a non-selected state.

With such a configuration, a power supply potential does not have to be increased, so that the circuit configuration can be simpler.

Here, a transistor whose off-state current is extremely low, as illustrated in the configuration example 1, can be used as the selection transistor 121. Thus, a data-holding period can be extremely lengthened, so that the memory cell can be used for a non-volatile storage device.

That is the description of the storage device illustrated in this configuration example.

The buffer circuit described in Embodiment 1 is applied to a storage device described in this embodiment. Thus, an on-state resistance of the selection transistor can be suppressed to be low, so that a data writing period is reduced and loss of a written potential can be suppressed. Further, a period required for writing, including a period prior to the start of the writing, can be extremely shortened; thus, a semiconductor device whose drive frequency is increased can be obtained. Furthermore, a boost operation of the potential of a gate line GL connected to the buffer circuit is performed only when the gate line GL is in a selected state, and is not performed when the gate line GL is in a non-selected state; thus, a semiconductor device with reduced power consumption can be obtained.

This embodiment can be combined with any of the other embodiments and example described in this specification as appropriate.

Embodiment 3

The display devices and the storage devices described in the above embodiments can be applied to a variety of electronic devices. In this embodiment, the case where the semiconductor device described in any of the above embodiments is applied to an electronic device is described with reference to FIGS. 9A to 9F. In this embodiment, applications of the semiconductor device to an electronic device such as a computer, a cellular phone set (also referred to as a cellular phone or a cellular phone device), a personal digital assistant (including a portable game machine, an audio reproducing device, and the like), a camera such as a digital camera or a digital video camera, electronic paper, or a television set (also referred to as a television or a television receiver) are described.

Figure 9A:
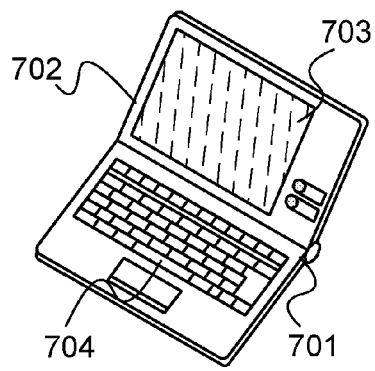
FIGS. 9A to 9F each illustrate a configuration example of an electronic device according to one embodiment of the present invention.

FIG. 9A illustrates a notebook personal computer including a housing 701, a housing 702, a display portion 703, a keyboard 704, and the like. Each of the housings 701 and 702 is provided with the semiconductor device described in the above embodiments. Thus, a notebook personal computer with low power consumption that operates at high speed can be provided.

Figure 9D:
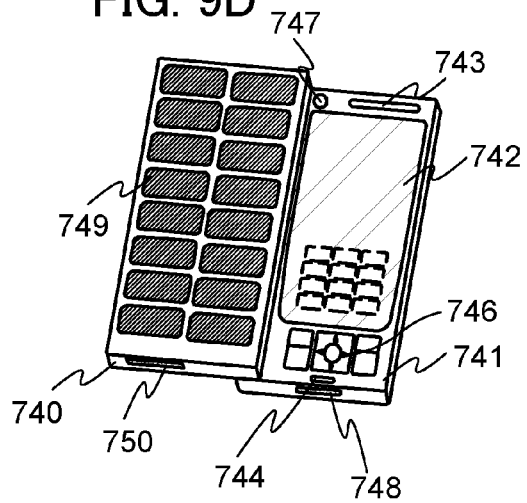
Figure 9B:
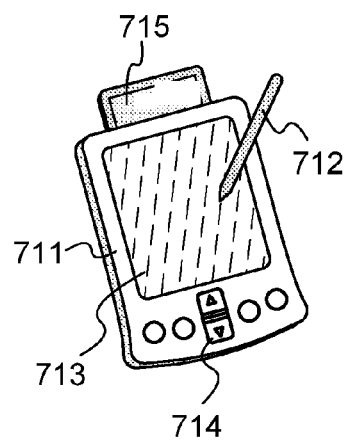

FIG. 9B illustrates a portable information terminal (PDA). A main body 711 is provided with a display portion 713, an interface 715, operation buttons 714, and the like. Further, a stylus 712 and the like for operation of the portable information terminal are provided. The main body 711 is provided with the semiconductor device described in the above embodiments. Thus, a portable information terminal with low power consumption that operates at high speed can be provided.

Figure 9E:
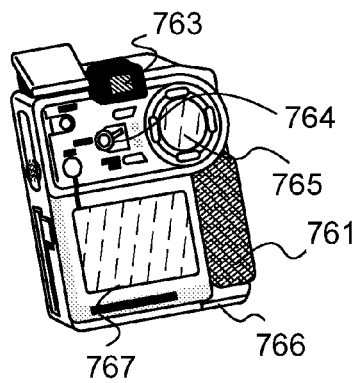
Figure 9C:
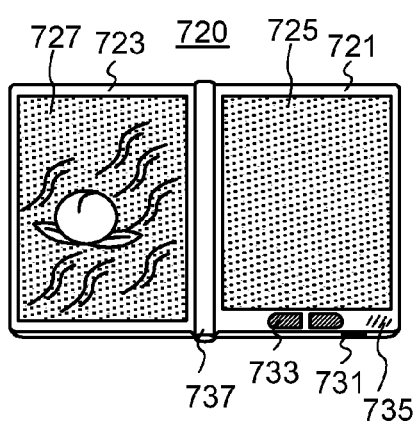

FIG. 9C illustrates an electronic book 720 including electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housing 721 and the housing 723 is provided with the semiconductor device described in the above embodiments. Thus, an electronic book with low power consumption that operates at high speed can be provided.

FIG. 9D illustrates a mobile phone set, which includes two housings, a housing 740 and a housing 741. Further, the housing 740 and the housing 741 in a state where they are developed as illustrated in FIG. 9D can shift by sliding so that one is lapped over the other. Therefore, the size of the mobile phone set can be reduced, which makes the mobile phone set suitable for being carried around. The housing 741 includes a display panel 742, a speaker 743, a microphone 744, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the semiconductor device described in the above embodiments. Thus, a mobile phone set with low power consumption that operates at high speed can be provided.

FIG. 9E illustrates a digital camera including a main body 761, a display portion 767, an eyepiece 763, an operation switch 764, a display portion 765, a battery 766, and the like. The main body 761 is provided with the semiconductor device described in the above embodiments. Thus, a digital camera with low power consumption that operates at high speed can be provided.

Figure 9F:
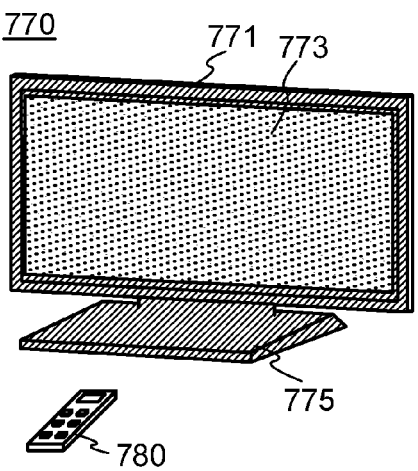

FIG. 9F illustrates a television set 770 including a housing 771, a display portion 773, a stand 775, and the like. The television set 770 can be operated with an operation switch of the housing 771 or a remote controller 780. The semiconductor device described in the above embodiments is mounted on the housing 771 and the remote controller 780. Thus, a television set with low power consumption that operates at high speed can be provided.

As described above, the electronic devices described in this embodiment each include the semiconductor device described in the above embodiments. Thus, an electronic device with low power consumption that operates at high speed can be provided. The number of power supply circuits or wirings can be reduced, so that the size of the device can be reduced. The case where power is supplied by a battery is especially preferable because driving period can be extended.

This embodiment can be combined with any of the other embodiments and example described in this specification as appropriate.

Example

In this example, the results of calculating input-output characteristics of a semiconductor device according to one embodiment of the present invention are described.

[Circuit Configuration]

Figure 10:
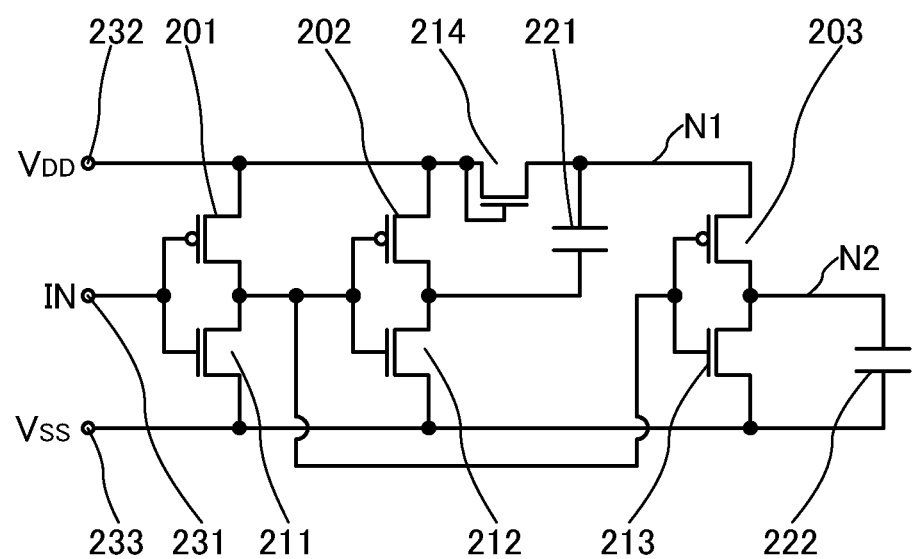
FIG. 10 illustrates a circuit according to Example.

First, a configuration of a circuit used for the calculation is described with reference to FIG. 10. FIG. 10 illustrates a circuit configuration used in this example.

The circuit includes a transistor 201, a transistor 202, a transistor 203, a transistor 211, a transistor 212, a transistor 213, a transistor 214, a capacitor 221, and a capacitor 222. The circuit further includes a terminal 231 to which an input signal IN (corresponding to the above-described selection signal IN) is supplied, a terminal 232 to which a high power supply potential VDD is input, and a terminal 233 to which a low power supply potential VSS is input.

Here, the transistor 201, the transistor 202, and the transistor 203 are p-channel transistors, and the transistor 211, the transistor 212, the transistor 213, and the transistor 214 are n-channel transistors.

A gate of the transistor 201 is connected to the terminal 231 and a gate of the transistor 211. A first electrode of the transistor 201 is connected to the terminal 232. A second electrode of the transistor 201 is connected to a first electrode of the transistor 211 and gates of the transistor 202, the transistor 212, the transistor 203, and the transistor 213. A first electrode of the transistor 202 is connected to the terminal 232. A second electrode of the transistor 202 is connected to a first electrode of the transistor 212 and a second electrode of the capacitor 221. A first electrode of the transistor 203 is connected to a second electrode of the transistor 214 and a first electrode of the capacitor 221. A second electrode of the transistor 203 is connected to a first electrode of the transistor 213 and one electrode of the capacitor 222. Second electrodes of the transistor 211, transistor 212, and transistor 213 are connected to the terminal 233. A gate and a first electrode of the transistor 214 are connected to the terminal 232. The other electrode of the capacitor 222 is connected to the terminal 233.

Here, as transistor characteristics used for the calculation in this example, a variety of values of characteristics of transistors estimated from a measurement of a thin film transistor was used. A semiconductor layer of the thin film transistor was formed using a single crystal silicon film that was transferred on a glass substrate.

As a threshold voltage of the transistor, calculation was performed under the assumption that the threshold voltage of n-channel transistors was 0.45 V and the threshold voltage of p-channel transistors was −0.82 V.

Further, as for a size (W/L: the ratio of the channel width (W) to the channel length (L)) of the transistors, in the p-channel transistors, when the transistor 201 is regarded as a reference, the size of the transistor 202 is one eighth that of the transistor 201, and the size of the transistor 203 is twice that of the transistor 201. In contrast, in the n-channel transistors, when the transistor 211 is regarded as a reference, the sizes of the transistor 212 and the transistor 214 are one eighth the size of the transistor 211, and the size of the transistor 213 is twice that of the transistor 211.

Further, as for a capacitance of the capacitors in the circuit, the capacitance of the capacitor 221 was 6.0 pF and the capacitance of the capacitor 222 was 3.0 pF.

Further, as for a potential input to the circuit, the high power supply potential VDD was 3 V and the low power supply potential VSS was 0 V. As the input signal IN, a pulsed signal having a high-level potential of 3 V and a low-level potential of 0 V was used.

[Input-Output Characteristics]

Then, input-output characteristics calculated with the use of the circuit illustrated in FIG. 10 are described. In this example, a potential change over time of a node (node N1) connected to the first electrode of the transistor 203 and a potential change over time of a node (node N2, corresponding to the above described gate line GL) connected to the second electrode of the transistor 203 when a pulsed signal whose pulse width was 11.54 μsec. was input to the terminal 231 were calculated.

Figure 11A:
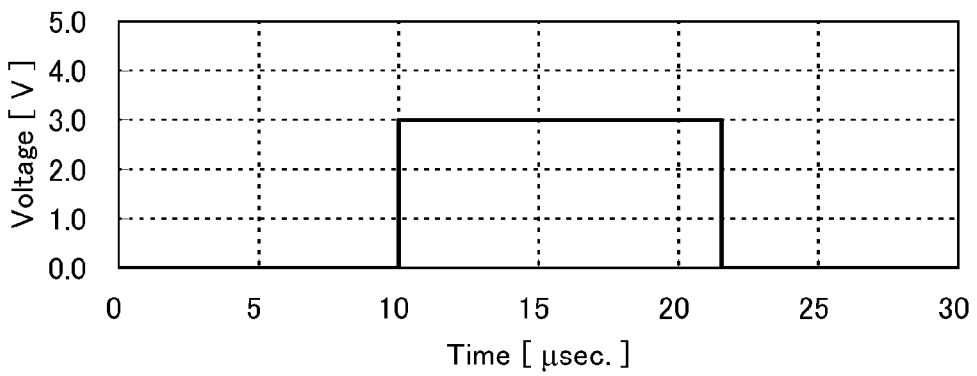
FIGS. 11A to 11C illustrate input-output characteristics according to Example.

FIG. 11A shows a potential change over time of the input signal IN that is input to the terminal 231. The input signal IN with the potential of 3 V is held from 10 μsec. to 21.54 μsec.

Figure 11B:
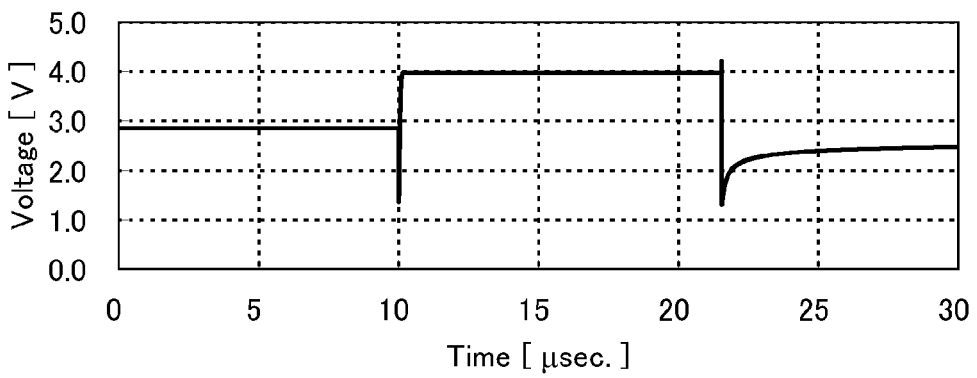

FIG. 11B shows a potential change over time of the node N1. Until just before the input signal IN rises, the node N1 holds a potential of approximately 2.9 V. With rising of the input signal IN, the potential rapidly rises to approximately 4.0 V and is held.

Figure 11C:
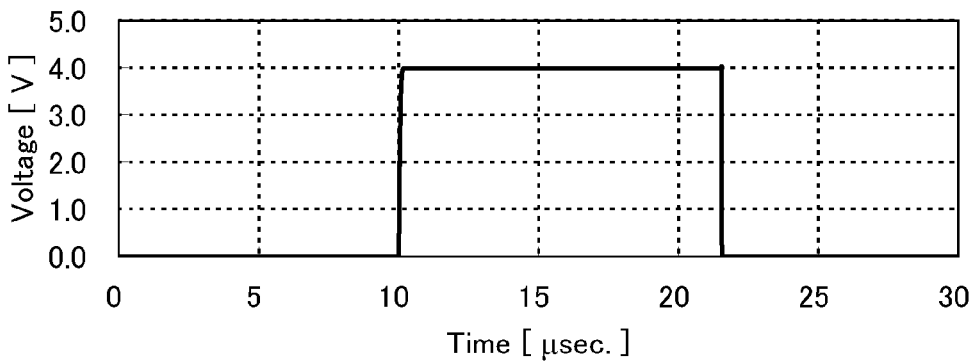

FIG. 11C shows a potential change over time of the node N2. With rising of the input signal IN, the potential of the node N2 rapidly rises from 0 V to 4.0 V and is held.

Figure 12A:
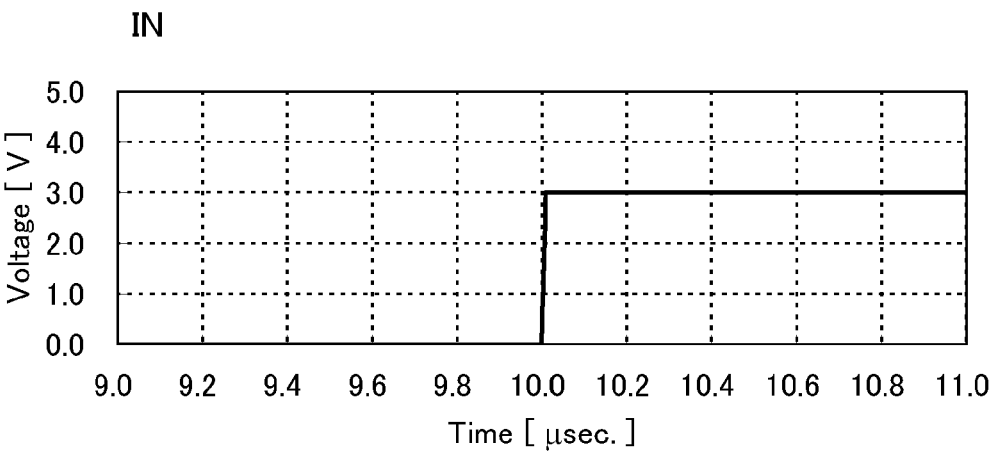
FIGS. 12A to 12C illustrate input-output characteristics according to Example.
Figure 12B:
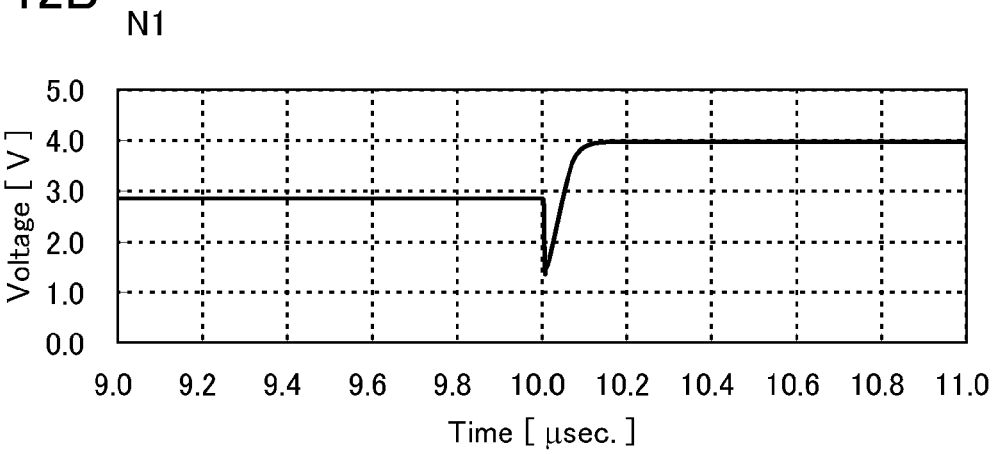
Figure 12C:
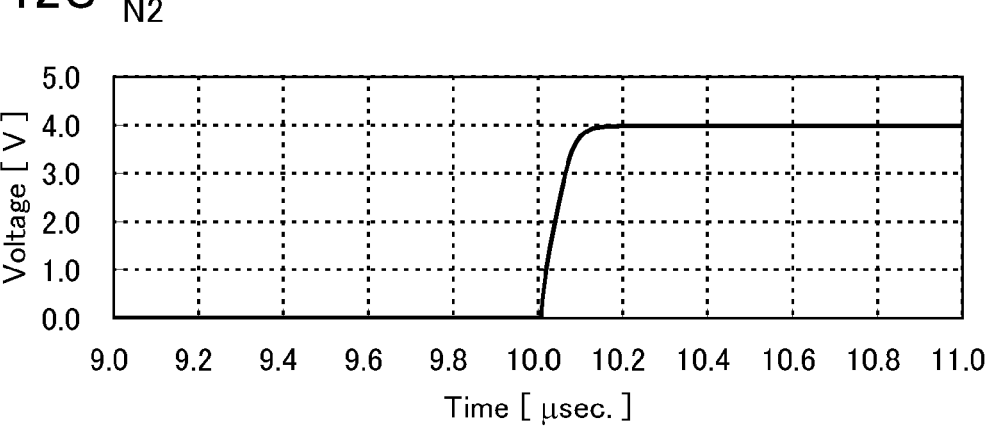

FIGS. 12A to 12C are graphs in which abscissa axes in FIGS. 11A to 11C are enlarged, respectively.

It is found that with rising of the input signal IN, the potentials of the node N1 and the node N2 rise to an arriving potential in an extremely short period, which is approximately 0.1 μsec.

From the above results, it is found that in the semiconductor device according to one embodiment of the present invention, after an input signal is input, the potential of the gate line GL is increased to a potential higher than the high power supply potential VDD in an extremely short period, and the potential can be held. Thus, with the semiconductor device according to one embodiment of the present invention, a semiconductor device whose power consumption is low and in which data can be read at high speed without increasing a power supply potential can be achieved.

Note that this example can be implemented in combination with any of the embodiments described in this specification as appropriate.

This application is based on Japanese Patent Application serial No. 2011-281648 filed with Japan Patent Office on Dec. 22, 2011, the entire contents of which are hereby incorporated by reference.

What is claimed is:

1. A semiconductor device comprising:
a circuit including a selection transistor; and
a buffer circuit electrically connected to a gate of the selection transistor through a first signal line,
wherein the buffer circuit comprises:
a first inverter and a second inverter that are sequentially connected in series; and
a bootstrap circuit,
wherein an input terminal of the first inverter is electrically connected to an input signal line to which a selection signal is input,
wherein an output terminal of the second inverter is electrically connected to the first signal line,
wherein a high-potential input terminal of the first inverter is electrically connected to a second signal line to which a first potential is input,
wherein low-potential input terminals of the first inverter and the second inverter are electrically connected to a third signal line to which a second potential lower than the first potential is input, and
wherein the bootstrap circuit outputs a third potential higher than the first potential to a high-potential input terminal of the second inverter in response to the selection signal.

2. The semiconductor device according to claim 1, wherein the bootstrap circuit comprises:
a diode;
a capacitor; and
a third inverter,
wherein an input terminal of the diode is electrically connected to the second signal line, and an output terminal of the diode is electrically connected to the high-potential input terminal of the second inverter,
wherein an input terminal of the third inverter is electrically connected to an output terminal of the first inverter, and
wherein one terminal of the capacitor is electrically connected to the high-potential input terminal of the second inverter, and the other terminal of the capacitor is electrically connected to an output terminal of the third inverter.

3. The semiconductor device according to claim 2,
wherein the ratio of the channel width to the channel length of a transistor included in the first inverter is one eighth that the ratio of the channel width to the channel length of a transistor included in the third inverter.

4. The semiconductor device according to claim 1, wherein the first inverter and the second inverter each include a transistor including an oxide semiconductor film.

5. The semiconductor device according to claim 1,
wherein the ratio of the channel width to the channel length of a transistor included in the first inverter is twice that the ratio of the channel width to the channel length of a transistor included in the second inverter.

6. The semiconductor device according to claim 1, wherein the first inverter and the second inverter each include a CMOS circuit.

7. An electronic device comprising the semiconductor device according to claim 1.

8. A semiconductor device comprising:
a circuit including a selection transistor; and
a buffer circuit electrically connected to a gate of the selection transistor through a first signal line,
wherein the buffer circuit comprises:
a first inverter and a second inverter that are sequentially connected in series; and
a bootstrap circuit,
wherein an input terminal of the first inverter is electrically connected to an input signal line to which a selection signal is input,
wherein an output terminal of the second inverter is electrically connected to the first signal line,
wherein a high-potential input terminal of the first inverter and an input terminal of the bootstrap circuit are electrically connected to a second signal line to which a first potential is input,
wherein low-potential input terminals of the first inverter and the second inverter are electrically connected to a third signal line to which a second potential lower than the first potential is input,
wherein an output terminal of the bootstrap circuit is electrically connected to a high-potential input terminal of the second inverter, and
wherein the bootstrap circuit boosts the first potential when the selection signal is input to the buffer circuit.

9. The semiconductor device according to claim 8,
wherein the bootstrap circuit comprises:
a diode;
a capacitor; and
a third inverter,
wherein an input terminal of the diode is electrically connected to the second signal line, and an output terminal of the diode is electrically connected to the high-potential input terminal of the second inverter,
wherein an input terminal of the third inverter is electrically connected to an output terminal of the first inverter, and
wherein one terminal of the capacitor is electrically connected to the high-potential input terminal of the second inverter, and the other terminal of the capacitor is electrically connected to an output terminal of the third inverter.

10. The semiconductor device according to claim 9,
wherein the ratio of the channel width to the channel length of a transistor included in the first inverter is one eighth that the ratio of the channel width to the channel length of a transistor included in the third inverter.

11. The semiconductor device according to claim 8, wherein the first inverter and the second inverter each include a transistor including an oxide semiconductor film.

12. The semiconductor device according to claim 8,
wherein the ratio of the channel width to the channel length of a transistor included in the first inverter is twice that the ratio of the channel width to the channel length of a transistor included in the second inverter.

13. The semiconductor device according to claim 8, wherein the first inverter and the second inverter each include a CMOS circuit.

14. An electronic device comprising the semiconductor device according to claim 8.

15. A semiconductor device comprising:
a circuit including a selection transistor; and
a buffer circuit electrically connected to a gate of the selection transistor through a first signal line,
wherein the buffer circuit comprises:
first to n-th inverters that are sequentially connected in series; and
a bootstrap circuit,
wherein an input terminal of the first inverter is electrically connected to an input signal line to which a selection signal is input,
wherein an output terminal of the n-th inverter is electrically connected to the first signal line,
wherein high-potential input terminals of the first to (n−1) th inverters are electrically connected to a second signal line to which a first potential is input,
wherein low-potential input terminals of the first to n-th inverters are electrically connected to a third signal line to which a second potential lower than the first potential is input, and
wherein the bootstrap circuit outputs a third potential higher than the first potential to a high-potential input terminal of the n-th inverter in response to the selection signal.

16. The semiconductor device according to claim 15,
wherein the bootstrap circuit comprises:
a diode;
a capacitor; and
an (n+1)-th inverter,
wherein an input terminal of the diode is electrically connected to the second signal line, and an output terminal of the diode is electrically connected to the high-potential input terminal of the n-th inverter,
wherein an input terminal of the (n+1)-th inverter is electrically connected to an output terminal of the (n−1)-th inverter, and
wherein one terminal of the capacitor is electrically connected to the high-potential input terminal of the n-th inverter, and the other terminal of the capacitor is electrically connected to an output terminal of the (n+1)-th inverter.

17. The semiconductor device according to claim 15, wherein the first to n-th inverters each include a CMOS circuit.

18. The semiconductor device according to claim 15, wherein the first to n-th inverters each include a transistor including an oxide semiconductor film.

19. An electronic device comprising the semiconductor device according to claim 15.

20. The semiconductor device according to claim 15, wherein n is an even number.

* * * * *